(12) United States Patent
Chen et al.

(10) Patent No.: US 6,563,353 B2
(45) Date of Patent: May 13, 2003

(54) CIRCUIT TO ELIMINATE BUS CONTENTION AT CHIP POWER UP

(75) Inventors: Ker-Min Chen, Hsin-Chu (TW); Wen-Tai Wang, Taipei (TW)

(73) Assignee: Taiwan Semiconductor Manufacturing Co., Ltd., Hain-Chu (TW)

( * ) Notice: Subject to any disclaimer, the term of this patent is extended or adjusted under 35 U.S.C. 154(b) by 0 days.

(21) Appl. No.: 10/100,051

(22) Filed: Mar. 19, 2002

(65) Prior Publication Data

US 2003/0042946 A1 Mar. 6, 2003

(30) Foreign Application Priority Data

Sep. 6, 2001 (TW) .......................................... 90122087 A

(51) Int. Cl.[7] ................................................ H03L 7/00
(52) U.S. Cl. .................................................... 327/143
(58) Field of Search ............................. 326/56, 57, 58; 327/142, 143, 198

(56) References Cited

U.S. PATENT DOCUMENTS 5,929,673 A * 7/1999 Haigis et al. ................ 327/143
6,329,840 B1 * 12/2001 Moyal .......................... 326/58

* cited by examiner

*Primary Examiner*—Jeffrey Zweizig
(74) *Attorney, Agent, or Firm*—Birch, Stewart, Kolasch & Birch, LLP

(57) ABSTRACT

A power-on control circuit for an integrated circuit of the type having plural voltage source. The circuit is powered on sequentially, thereby preventing bus contention. The power-on control circuit includes a power-on detection for generating an enabling signal and disabling signal to control output buffer. When the high voltage source is powered on and the low voltage is not, the output buffer is at a high impedance state to prevent bus contention. When the low voltage is powered on after the high voltage is powered on, the output buffer is at a normal state.

8 Claims, 4 Drawing Sheets

CIRCUIT TO ELIMINATE BUS CONTENTION AT CHIP POWER UP

BACKGROUND OF THE INVENTION

1. Field of the Invention

The present invention relates in general to the field of an integrated circuit technology. In particular, it relates to a power-on detection circuit at output buffer to ensure output buffer tri-state when high voltage is powered on.

2. Description of the Related Art

In order to prevent leakage and latch up in an ESD device of an IC with plural voltage supply, power-on sequence must be precise in output buffer design. The power-on sequence turns on the high voltage source first and the low voltage source second, but, bus contention results. FIG. 1A shows the function block of the I/O circuits and the bus. FIG. 1B shows a conventional output buffer 30. The I/O voltage source VD33 is powered on, but the core voltage source VDD is not. A PMOS 41 in an output buffer 30 of a circuit 101 is turned on such that a output terminal 40 of the circuit 101 is at high voltage level. A NMOS 40 in a output buffer 30 of a circuit 103 is turned on that an output terminal 40 of the circuit 103 is at low voltage level. Neither a PMOS 41 nor a NMOS 42 is turned on in a output buffer 30 of a circuit 105 such that a output terminal 40 of the circuit 105 is at high-impedance. A short current starts from the circuit 101 to the circuit 103 through a bus 102. This causes a bus contention among the circuit 101, the circuit 103, and the circuit 105.

The disadvantage of the conventional output buffer is that the state of the output terminal is undetermined when the I/O voltage source is powered on. There are three possible states: high voltage level, low voltage level, or high impedance, creating bus contention. It is necessary to add a power-on detect circuit in a output buffer to ensure the output buffer is at high impedance when I/O voltage source is power-on.

FIG. 2 shows a conventional power-on detect circuit. The gate of a PMOS 62 is coupled to a test signal 67, the source is coupled to a power supply 75, and the drain is coupled to a node B. The gate of a NMOS 63 is coupled to a power supply 75, the source is coupled to a ground, and the drain is coupled to a node B. The input terminals of a NOR gate 65 couple to the test signal 67 and the node B respectively, the output terminal generates reset signal 66 to the reset of a standby flag 61. The input terminals of AND gate 68 couple to a write signal 69 and node A respectively, and the output terminal of it couples to the set of the standby flag 61. A standby flag implemented by a R/S latch flip-flop has its output coupled to a bus driver 70. The control terminal of the bus driver is coupled to a read signal 71, and the output terminal of it is coupled to the node A.

As shown in FIG. 3, the power supply 75 is powered on at time t1, the test signal 67 is at low voltage level, such that the PMOS 62 turns on. At time t2, the voltage of the power supply increases gradually such that the NMOS turns on and the power-on detect signal 64 (i.e. the node B) is maintained at a low level until the power supply 75 becomes the inversion level. Therefore, the NOR gate 65 is supplied with two low level input signals, so that the NOR gate 65 supplies a high level reset signal 66 to the reset terminal of the standby flag 61 to be reset. At time t3, the power supply 75 increases to the inversion level, power-on detecting signal 64 reaches a high level, so that the NOR gate 65 supplies a low level reset signal 66 to the standby flag 61. The standby flag 61 is set when the AND gate 68 supplies a high logic level on the condition that the write signal 69 is active and the bus 72 is at a high level. An output signal of the standby flag 61 is supplied to the bus 72 through the bus driver 70 when a read signal 71 supplied to the bus 72 becomes active. At time t4, the test signal 67 is set be high, so that the PMOS 62 is turned off and the power-on detecting signal 64 is at a low level. During the times t3 to t4, a constant current I1 flows through the PMOS 62 and the NMOS 63.

There are two disadvantages in the conventional power-on detect circuit. First, an extra test signal is needed to control the duration of the power-on detecting signal. Second, a constant current flows through the power-on detect circuit when the power-on detecting signal is active.

BRIEF DESCRIPTION OF THE DRAWINGS

The present invention can be more fully understood by reading the subsequent detailed description in conjunction with the examples and references made to the accompanying drawings, wherein.

DETAILED DESCRIPTION OF THE PREFERRED EMBODIMENT

The present invention utilizes a power-on detection circuit to ensure an output buffer is at high impedance when only high voltage is powered on. The output buffer operates normally when low voltage is powered on.

Figure 1A:
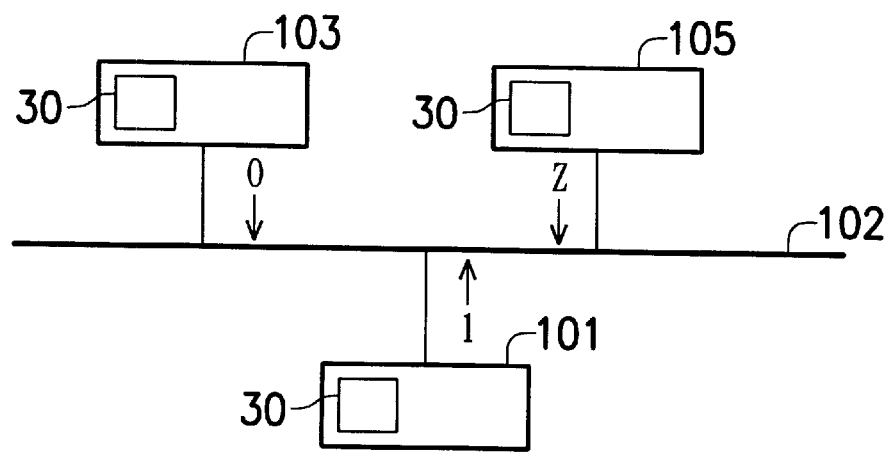
FIG. 1A is a block diagram of conventional I/O circuits and the bus.
Figure 1B:
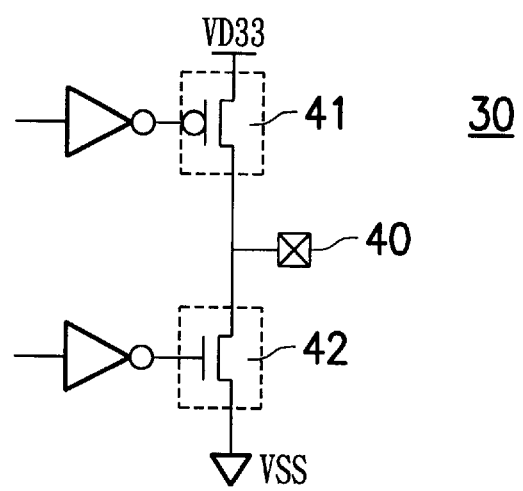
FIG. 1B is a schematic diagram of a conventional output buffer.
Figure 2:
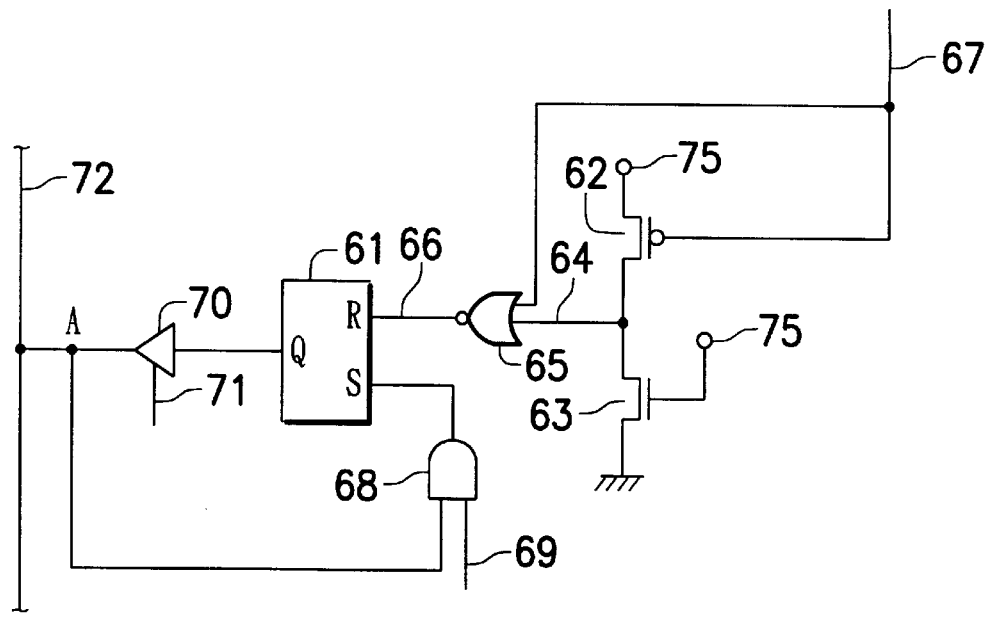
FIG. 2 is a schematic diagram of a conventional power-on detect circuit.
Figure 3:
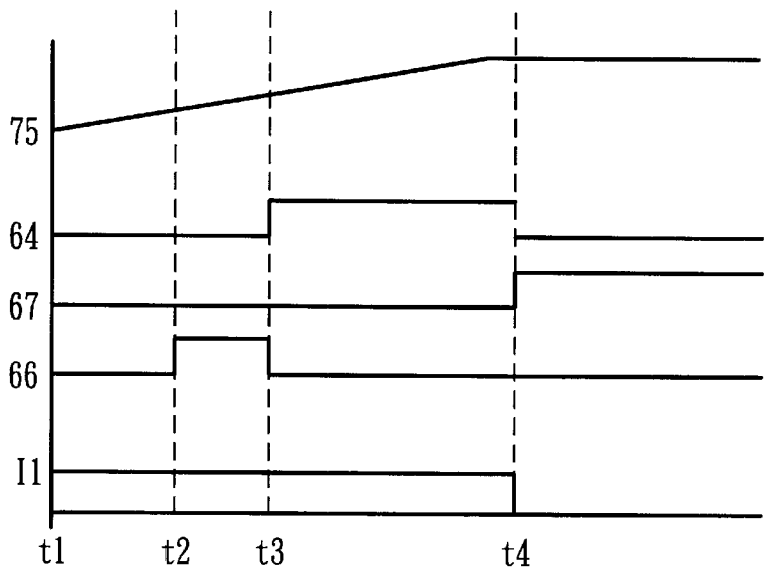
FIG. 3 shows a time chart of the conventional power-on detect circuit.
Figure 4:
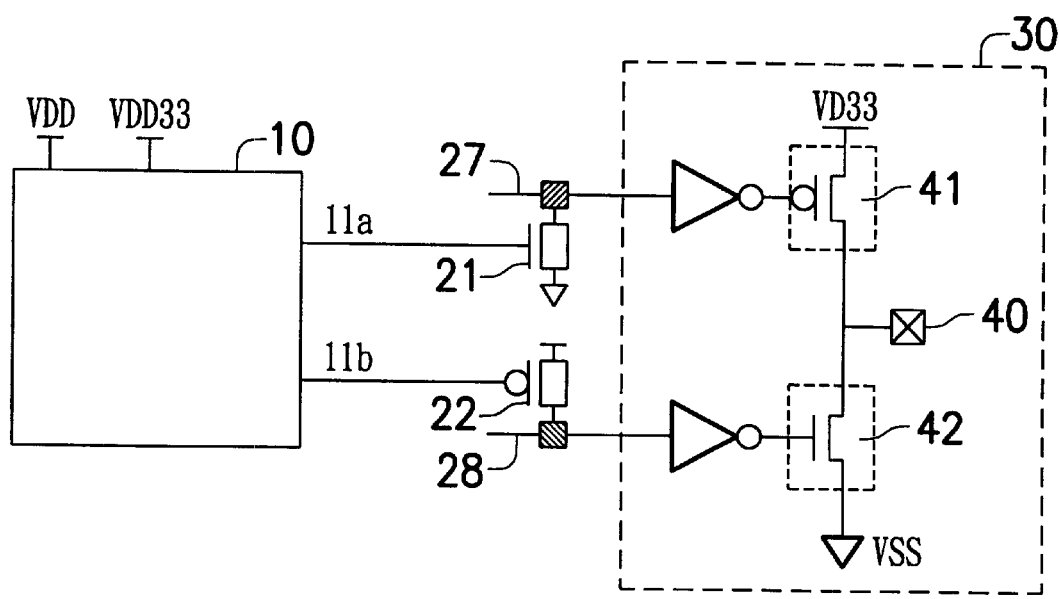
FIG. 4 is a function block diagram of the present invention.

FIG. 4 illustrates the operation between a power-on detection circuit and a output buffer. The architecture in FIG. 4 includes a power-on detection circuit 10, a pull up circuit 22, a pull down circuit 21, an output buffer 30. The power-on detection circuit is coupled to I/O voltage source VD33 and core voltage source VDD, generating two control signals coupled to a pull-down circuit and a pull-up circuit through signal lines 11a and 11b respectively. The pull-down circuit 21 is coupled between the input terminal 27 and a low voltage level. The pull up circuit 22 is coupled between the input terminal 28 and a high voltage level. The power-on detection circuit detects the power-on sequence. When the I/O voltage source is powered on and the core voltage is not, the two control signals enable the pull down circuit 21 and the pull up circuit 22. The input terminal 27 is coupled to the low voltage level, so that a PMOS 41 of the output buffer 30 is turned off. The input terminal 28 is coupled to the high voltage level, so that a NMOS 42 of the output buffer 30 is turned off. Therefore, the output buffer 30 is at high impedance to prevent bus contention.

The core voltage source VDD is powered on after the I/O voltage source is powered on. The power-on detection circuit 10 outputs a control signal to disable the pull down circuit 21 and pull up circuit 22. Thus, the input terminal 27 and input terminal 28 of the output buffer 30 are enabled, that is, they can receive the internal signal.

Figure 5:
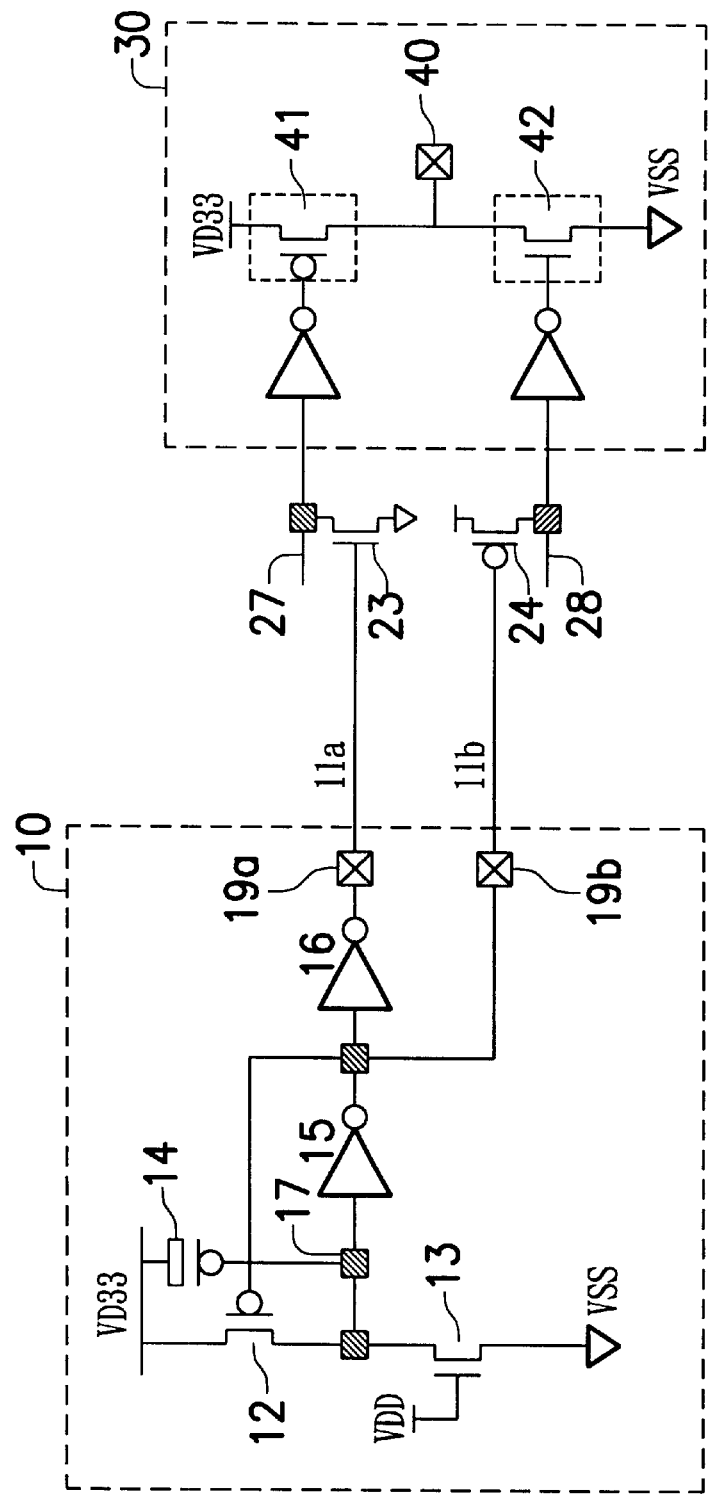
FIG. 5 is a schematic diagram of the present invention.

Accordingly, a schematic of the present invention is shown in FIG. 5. The power-on detection circuit 10 includes a PMOS 12, a PMOS 14, a NMOS 13, an inverter 15, and an inverter 16. A source of the PMOS 12 to the I/O voltage source VD33. The NMOS 13 is connected at a drain to a node 17, the drain of the PMOS 12, at a gate to core voltage source VDD, and a source to a low voltage level VSS. The PMOS 14, acting as a capacitance is connected at a drain and a source both to the I/O voltage source VD33, and at a gate to the node 17. An inverter 15 is connected at the input terminal to the node 17, and at an output terminal 19b to the gate of the PMOS 12 and to the signal line 11b. An inverter 16 is connected at an input terminal to the output terminal 19b, and at an output 19a to the signal line 11a. A PMOS 24 is connected at a drain to the input terminal 28, at a source to a high voltage level, and a gate to the signal line 11b. A NMOS 23 is connected at a drain to the input terminal 27, at source to a low voltage level, and a gate to the signal 11a.

The PMOS 12, the NMOS 14, and the inverter 15 form a positive feedback loop. When the core voltage source VDD is not powered on, the NMOS 13 is turned off. In such a state, when the I/O voltage source VD33 is powered on, the capacitance of the PMOS 14 and the parasitic capacitance of the NMOS 13 couple a voltage drop to the node 17, so that the inverter 15 inverts the voltage to supply a low voltage to turn on the PMOS 12 to charge the node 17. Therefore, the node 17 is latched at a high voltage, and the output terminal 19b is at low voltage supplied to the inverter 16 such that the output terminal 19a is at high voltage.

The NMOS 23 is turned on by the signal line 11a, the input terminal 27 is pulled down to a low voltage level, and the PMOS 41 is turned off. The PMOS 24 is turned on by the signal line 11b, the input terminal 28 is pulled up to a high voltage level, and the NMOS 42 is turned off. Thus, the output terminal 40 of the output buffer 30 is at high impedance to prevent bus contention.

When the core voltage source VDD is powered on after the I/O voltage source VD33 is powered on, the NMOS 13 is turned on thereby. The NMOS 13 pulls down the voltage of the node 17 to a low level such that the inverter 15 supplies a high voltage to the gate of the PMOS 12 to turn off the PMOS 12 to break off the positive feedback loop. The gate of the PMOS 24 is turned off by a high voltage of the output terminal 19b. The output terminal 19a of the inverter 16 is inverted to a low voltage level owing to the output terminal 19b being at a high voltage level. The gate of the NMOS 23 is turn off by a high voltage of the output terminal 19b. Thus, the input terminal 27 and the input terminal 28 are enabled, such that they can receive the internal signal.

There are four advantages concluded from the above description of the present invention. First, it can detect the state when only the high voltage source is powered on. Second, when only high voltage source is powered on, it ensures the output buffer is at high impedance. Third, the powered on detection circuit utilizes the couple capacitance, so that it responds quickly. Fourth, the power-on detection circuit requires a small layout area.

While the invention has been described with reference to various illustrative embodiments, the description is not intended to be construed in a limiting sense. Various modifications of the illustrative embodiments, as well as other embodiments of the invention, will be apparent to those persons skilled in the art upon reference to this description. It is therefore contemplated that the appended claims will cover any such modification or embodiments as may fall within the scope of the invention defined by the following claims and their equivalents.

What is claimed is:

1. A power-on control circuit for an integrated circuit of the type having a first high voltage source, having a second high voltage source, and having an output buffer with a first input terminal and a second input terminal, wherein the voltage of the first high voltage source is higher than the voltage of the second high voltage source, comprising:
    a pull-down circuit connected between the first input terminal and a first reference voltage, and receiving a first signal;
    a pull-up circuit connected between the second input terminal and a second reference voltage, and receiving a second signal;
    a power-on detection circuit coupled to the first high voltage source and to the second high voltage source, and generating the first signal and the second signal, when the first high voltage source is powered on and the second high voltage is not powered on, the first signal enabling the pull-down circuit to make the first input terminal coupled to the first reference voltage and disabled, the second signal enabling the pull-up circuit to make the first input terminal coupled to the second reference voltage and disabled, such that an output terminal of the output buffer is at high impedance, and when the first high voltage source is powered on and the second high voltage is powered on, the first signal disabling the pull-down circuit, and the second signal disabling the pull-up circuit.

2. The power-on control circuit as claimed in claim 1, wherein the power-on detection circuit comprises:
    a first inverter having an output terminal generating the first signal;
    a second inverter having an output terminal coupled to a input terminal of the first inverter and generating the second signal;
    a first PMOS transistor, having a source coupled to the first high voltage source, having a drain coupled to the input terminal of the second inverter, and having a gate coupled to the output terminal of the second inverter;
    a second NMOS transistor, having a drain coupled to the input terminal of the second inverter, having a source coupled to a low voltage source, and having a gate coupled to the second high voltage source; and
    a third PMOS transistor, having a drain coupled to the first high voltage source, having a source coupled to the first high voltage source, and having a gate coupled to the input terminal of the second inverter.

3. The power-on control circuit as claimed in claim 1, wherein the pull down circuit comprises:
    a NMOS transistor, having a gate coupled to the first signal, having a drain coupled to the first input terminal, and having a source coupled to the first reference voltage.

4. The power-on control circuit as claimed in claim 1, wherein the pull up circuit comprises:
    a PMOS transistor, having a gate coupled to the second signal, having a drain coupled to the second input terminal, and having a source coupled to the first high voltage source.

5. The power-on control circuit as claimed in claim 1, wherein the output buffer comprises: a third inverter having its input terminal coupled to the second input terminal;
    a PMOS transistor having a gate coupled to a output terminal of the third inverter, having a drain coupled to a output pad, and having a source coupled to the first high voltage source;
    a fourth inverter having its input terminal coupled to the second input terminal; and a NMOS transistor having a gate coupled to the output terminal of the fourth inverter, having a drain coupled to the pad, and having a source coupled to the low voltage source.

6. The power-on control circuit as claimed in claim 1, wherein the first reference voltage is the low voltage.

7. The power-on control circuit as claimed in claim 1, wherein the second reference voltage is the first high voltage source.

8. A power-on control circuit for an integrated circuit of the type having a first high voltage source, having a second high voltage source, and having an output buffer with a first input terminal and a second input terminal, wherein the voltage of the first high voltage source is higher than the voltage of the second high voltage source, comprising:

- a pull down circuit connected between the first input terminal and a first reference voltage, and receiving a first signal;
- a pull up circuit connected between the second input terminal and a second reference voltage, and receiving a second signal;
- a first inverter having an output terminal generating the first signal;
- a second inverter having an output terminal coupled to a input terminal of the first inverter and generating the second signal;
- a first PMOS transistor, having a source coupled to the first high voltage source, having drain coupled to the input terminal of the second inverter, and having a gate coupled to the output terminal of the second inverter;
- a second NMOS transistor, having a drain coupled to the input terminal of the second inverter, having a source coupled to a low voltage source, and having a gate coupled to the second high voltage source; and
- a third PMOS transistor, having a drain coupled to the first high voltage source, having a source coupled to the first high voltage source, and having a gate coupled to the input terminal of the second inverter.

* * * * *

UNITED STATES PATENT AND TRADEMARK OFFICE
CERTIFICATE OF CORRECTION

| | | |
|---|---|---|
| PATENT NO. | : 6,563,353 B2 | Page 1 of 1 |
| APPLICATION NO. | : 10/100051 | |
| DATED | : May 13, 2003 | |
| INVENTOR(S) | : Ker-Min Chen et al. | |

It is certified that error appears in the above-identified patent and that said Letters Patent is hereby corrected as shown below:

In Col. 4, line 22, delete "first" and insert --second--.

Signed and Sealed this
Nineteenth Day of April, 2011

David J. Kappos
*Director of the United States Patent and Trademark Office*